United States Patent
Masthoff et al.

(10) Patent No.: US 11,097,616 B2
(45) Date of Patent: Aug. 24, 2021

(54) OPERATING DEVICE FOR A VEHICLE COMPONENT

(71) Applicant: BEHR-HELLA THERMOCONTROL GMBH, Stuttgart (DE)

(72) Inventors: Klaus-Martin Masthoff, Lippstadt (DE); Tobias Schwab, Lippstadt (DE); Matthias Stallein, Lippstadt (DE)

(73) Assignee: BEHR-HELLA THERMOCONTROL GMBH, Stuttgart (DE)

( * ) Notice: Subject to any disclaimer, the term of this patent is extended or adjusted under 35 U.S.C. 154(b) by 46 days.

(21) Appl. No.: 16/346,695

(22) PCT Filed: Oct. 27, 2017

(86) PCT No.: PCT/EP2017/077653
§ 371 (c)(1),
(2) Date: May 1, 2019

(87) PCT Pub. No.: WO2018/083039
PCT Pub. Date: May 11, 2018

(65) Prior Publication Data
US 2019/0278386 A1    Sep. 12, 2019

(30) Foreign Application Priority Data

Nov. 4, 2016    (DE) .................... 10 2016 121 076.5

(51) Int. Cl.
*B60K 35/00*    (2006.01)
*B60K 37/06*    (2006.01)
(Continued)

(52) U.S. Cl.
CPC .............. *B60K 35/00* (2013.01); *B60K 37/06* (2013.01); *B60R 16/03* (2013.01); *G06F 3/016* (2013.01);
(Continued)

(58) Field of Classification Search
CPC .. G05G 1/02; G05G 1/08; G05G 1/10; G05G 1/12; G05G 1/00; G05G 1/082;
(Continued)

(56) References Cited

U.S. PATENT DOCUMENTS 5,936,613 A * 8/1999 Jaeger ................. G02F 1/13338
345/172
5,982,355 A * 11/1999 Jaeger ................. G02F 1/13306
345/161

(Continued)

FOREIGN PATENT DOCUMENTS

DE    10 2006 026 187 A1    12/2007
DE    10 2010 010 574 A1    9/2011
(Continued)

OTHER PUBLICATIONS

International Search Report and Written Opinion issued in International Application No. PCT/EP2017/077653 dated Feb. 13, 2018.
(Continued)

*Primary Examiner* — Nitin Patel
*Assistant Examiner* — Amen W. Bogale
(74) *Attorney, Agent, or Firm* — Morgan, Lewis & Bockius LLP

(57) ABSTRACT

The operating device for a vehicle component, in particular a human machine interface (HMI) for vehicles, is provided with a housing, comprising a front wall having a front face in particular with a display surface and a rear face facing away from the front face, and an operating element unit which is positioned and/or can be positioned on and/or in front of the front wall of the housing for manually triggering operating functions and/or for manually adjusting parameters of operating functions for a vehicle component. The operating element unit comprises at least one operating element, a display element and/or a display device, an
(Continued)

Figure 1:
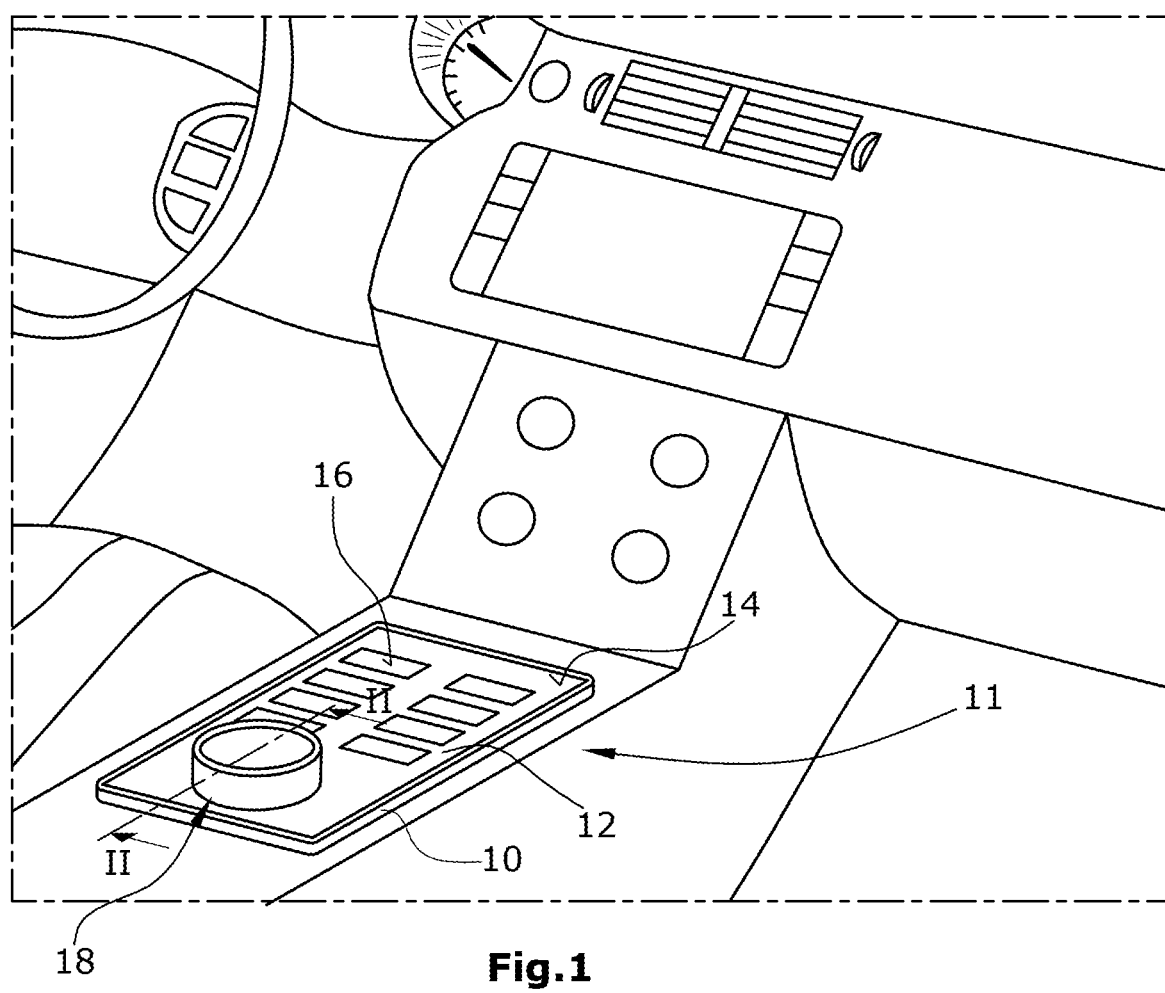

evaluating and control unit assigned to the at least one operating element and to the display element or the display device, and an energy supply unit. In order to supply electric energy to the energy supply unit of the operating element unit, at least one first coil is arranged so as to face the rear face of the front wall, wherein at least one second coil, which is inductively coupled to the at least one first coil and is connected to the energy supply unit, is arranged in and/or on the operating element unit.

18 Claims, 5 Drawing Sheets

(51) Int. Cl.
| | | |
|---|---|---|
| *B60R 16/03* | (2006.01) | |
| *G06F 3/0362* | (2013.01) | |
| *G06F 3/038* | (2013.01) | |
| *G06F 3/041* | (2006.01) | |
| *H01F 38/18* | (2006.01) | |
| *H03K 17/00* | (2006.01) | |
| *G08C 17/00* | (2006.01) | |
| *B60Q 3/14* | (2017.01) | |
| *G06F 3/01* | (2006.01) | |
| *G06F 3/02* | (2006.01) | |
| *G06F 3/0354* | (2013.01) | |
| *H03K 17/96* | (2006.01) | |
| *G05G 1/08* | (2006.01) | |

(52) U.S. Cl.
CPC ............ *G06F 3/0202* (2013.01); *G06F 3/038* (2013.01); *G06F 3/0362* (2013.01); *G06F 3/03547* (2013.01); *G06F 3/041* (2013.01); *G08C 17/00* (2013.01); *H01F 38/18* (2013.01); *H03K 17/00* (2013.01); *B60K 2370/11* (2019.05); *B60K 2370/126* (2019.05); *B60K 2370/143* (2019.05); *B60K 2370/145* (2019.05); *B60K 2370/1434* (2019.05); *B60K 2370/1442* (2019.05); *B60K 2370/1537* (2019.05); *B60K 2370/34* (2019.05); *B60Q 3/14* (2017.02); *G05G 1/08* (2013.01); *G06F 2203/0381* (2013.01); *H03K 17/9622* (2013.01); *H03K 2217/94068* (2013.01); *H03K 2217/96031* (2013.01); *H03K 2217/96062* (2013.01)

(58) Field of Classification Search
CPC .............. B60K 37/06; B60K 2370/126; B60K 2370/128; B60K 2370/145; B60K 2370/1537; B60K 2350/102; B60K 2350/1024; B60K 2350/104; B60K 2350/1004; B60K 2350/1032; B60K 2350/2004; B60K 2350/2039; B60K 35/00; F24C 7/08; H01F 38/18; H03K 17/965; H03K 17/975; H03K 17/962; H03K 17/00; H03K 17/9622; H03K 2217/94073; H03K 2217/94057; H03K 2217/94068; H03K 2017/9706; H02J 50/00; H02J 50/001; H02J 50/005; H02J 50/10; H02J 50/12; H02J 50/30; H02J 50/40; H02J 50/402; H02J 50/50; H02J 50/502; H02J 50/60; H02J 50/70; H02J 50/80; H02J 50/90; H02J 50/05; H02J 5/00; H02J 5/005; H02J 7/00; H02J 7/0042; H02J 7/0044; H02J 7/0045; H02J 7/025; B60R 16/03; B60R 16/02; B60R 16/027; G08C 17/06; G08C 17/00; G06F 3/016; G06F 3/03; G06F 3/039; G06F 3/0362; G06F 3/0488; G06F 3/046; G06F 3/038; G06F 3/0202; G06F 3/03547; G06F 3/0393; G06F 3/041–0416; H04B 5/0025; H04B 5/0031; H04B 5/0037; H04W 4/80; H04M 1/7253

See application file for complete search history.

(56) References Cited

U.S. PATENT DOCUMENTS

| | | | | |
|---|---|---|---|---|
| 2007/0181410 | A1* | 8/2007 | Baier | G05G 1/025 200/17 R |
| 2008/0029316 | A1* | 2/2008 | Jaeger | G06F 3/046 178/19.01 |
| 2008/0084271 | A1* | 4/2008 | Jaeger | H04B 5/02 340/5.1 |
| 2009/0267921 | A1* | 10/2009 | Pryor | G06F 3/04883 345/177 |
| 2010/0259375 | A1* | 10/2010 | Ferren | B60K 35/00 340/462 |
| 2011/0050626 | A1* | 3/2011 | Porter | H03K 17/96 345/174 |

FOREIGN PATENT DOCUMENTS

| | | |
|---|---|---|
| DE | 20 2015 101 334 U1 | 7/2016 |
| EP | 2 251 762 A2 | 11/2010 |

OTHER PUBLICATIONS

International Written Opinion issued in International Application No. PCT/EP2016/077653 dated Sep. 29, 2018.
International Preliminary Examination Report issued in International Application No. PCT/EP2016/077653 dated Jan. 29, 2019.

* cited by examiner

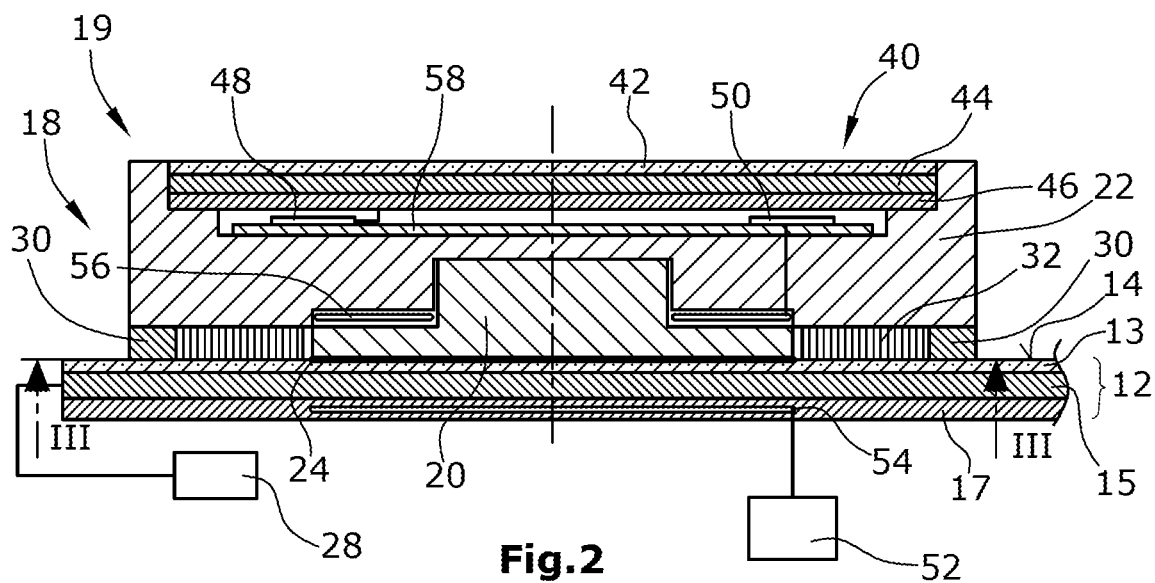
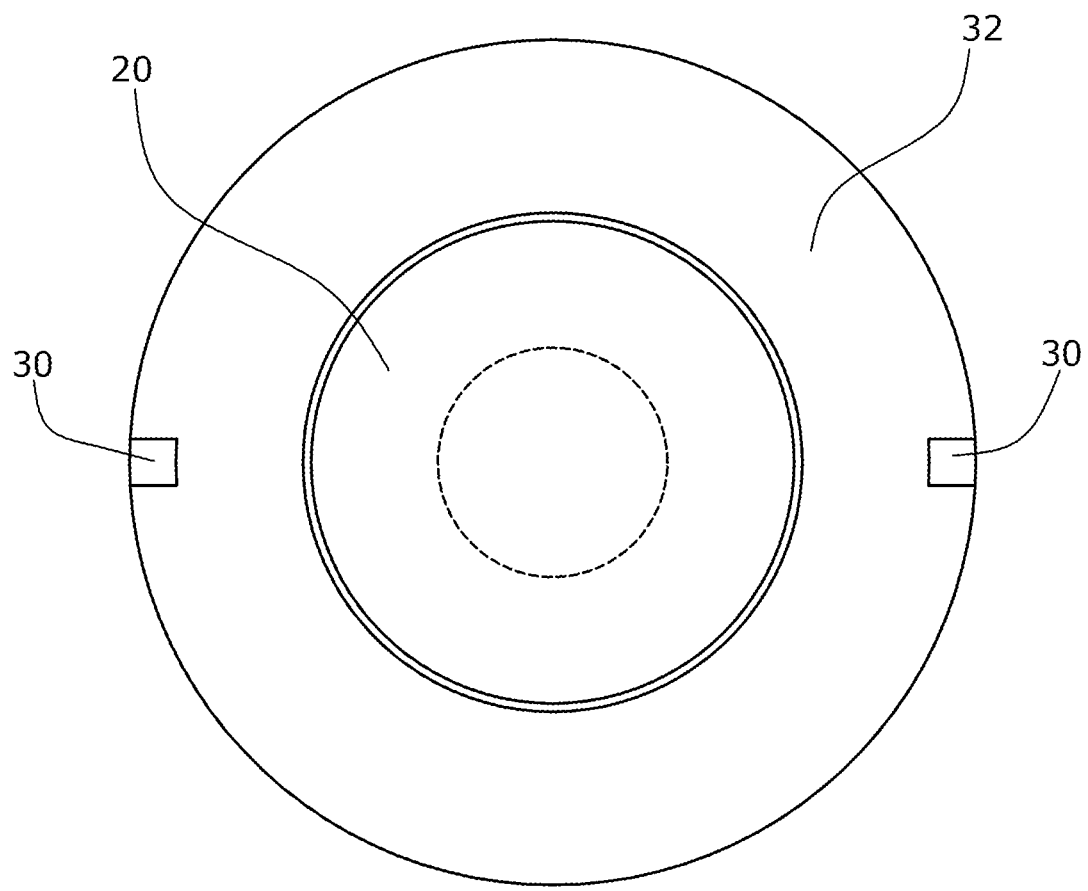

OPERATING DEVICE FOR A VEHICLE COMPONENT

This application is the U.S. National Phase under 35 U.S.C. § 371 of International Application No. PCT/EP2017/077653 filed on Oct. 27, 2017, which claims the benefit of German Application No. 10 2016 121 076.5 filed on Nov. 4, 2016, the entire contents of each are hereby incorporated by reference.

The invention relates to an operating device for a vehicle component, in particular a human-machine interface (HMI) for vehicles.

Operating devices for vehicle components should have a high degree of operating comfort in order to increase user acceptance. It is known that operating element units with keys and/or rotary adjusters are used, and there is an increasing trend to equip such operating elements with "own" display elements or devices, i.e. displays. In order to be operated these components require electric energy that is permanently available for maintaining operational safety and is therefore typically supplied by cable.

A keyboard and a pointing device (mouse) both without battery are known from DE-A-198 54 367, whereby it should be mentioned that such a data entry device is not taken into account in the design of an operating unit for a vehicle.

Further data entry and data transfer devices are described in DE-A-196 52 491 and DE-U-20 2015 101 334.

It is advantageous both in terms of construction and reducing the assembly effort if the energy supply to electrical or electronic components of operating element units in vehicles is simplified, with one of the difficulties being to have to meet the EMC requirements for motor vehicles.

Therefore, an object of the invention is to create an operating device for a vehicle component whose housing is provided in particular with an "attached" or "attachable" operating element unit whose energy supply is simplified in terms of construction.

According to the invention, this object is achieved by an operating device for a vehicle component, in particular a human-machine interface (HMI) for vehicles, whereby the operating device is provided with a housing having a front wall comprising a front face in particular with a display surface and a rear face facing away from the front face, and an operating element unit positioned or positionable on and/or in front of the front wall of the housing for manually triggering operating functions and/or for manually adjusting parameters of operating functions for a vehicle component, wherein the operating element unit comprises at least one operating element, an electric consumer (e.g. a display element and/or a display device or a pressure and rotary sensor system), an evaluating and control unit assigned to the electric consumer and an energy supply unit, and wherein in order to supply electric energy to the energy supply unit of the operating element unit at least one first coil is arranged so as to face the rear face of the front wall, and at least one second coil, which is inductively coupled to the at least one first coil and connected to the energy supply unit, is arranged in and/or on the operating element unit.

In the following, the invention is described as an electric consumer by using the examples of a display device respectively of a display element and/or of a functional sensor system (press function, rotary function, force-sense function, force-feedback function). However, this shall not limit the scope of the invention.

According to the invention, it is required to inductively supply electric energy required for operating the operating unit to an energy supply unit of the operating element unit. Thus, energy is supplied wirelessly, which reduces the construction and assembly effort for the operating device. It is now in particular possible to removably position an operating element unit to be supplied with electric energy on the front face of the housing. Under certain circumstances this can also be done from a safety point of view in order to make unauthorized access to the vehicle appear less attractive, since with an unauthorized access the vehicle cannot be operated at all or only to a limited extent.

It could certainly also be possible to supply energy to the operating element unit by a replaceable or a rechargeable battery. With the inductive energy supply according to the invention, it is always guaranteed that the operating element unit is provided with enough electric energy so that the driver does not need to worry about replacing or recharging the battering.

According to the invention, a first (energy transmission) coil is located in the housing so as to face the rear face of the front wall of the housing, while a second (energy transmission) coil is arranged in the operating element unit. It is also conceivable that the housing is provided with a plurality of first coils arranged adjacent to each other so that, depending on the positioning for the in this case removable operating element unit on the front wall of the housing, the second coil is supplied with energy by a first coil in order to inductively supply electric energy to the second coil. The first coils can be coded so that the operating device receives information about which one of the first coils is currently supplying the operating element unit with electric energy, and thus communicates with the operating element unit. Thus, it is possible to display various display contents on, for example, the display, which forms the front face of the housing and on which the operating element unit can be positioned.

The invention is particularly relevant if the front wall of the housing comprises a display. The display can be a touchscreen. The display can for example be an LCD, an LED, a micro LED, an OLED, a Q-dot or an E-Ink display. It is important that basically all "active" display types can be used as long as their structure does not comprise an indicative full shielding arranged between the front face and the rear face of the display, as for example a metallization layer or the like, which is not absolutely necessary for operating the corresponding display type.

Surprisingly, it has turned out that electric energy can be inductively transported through an LCD display in order to operate an operating element unit arranged on the front face of the display, whereby the image content of the display, through which the charge is inductively transported, is visually not affected. For this purpose, for example the Qi charging standard for mobile phones can be used.

It is further possible to use the inductively coupled coils not only for the energy supply but also for data communication. In this way, it would be, for example, possible, after starting the vehicle and activating the inductive energy transmission, to feed back to the operating element unit through the operating element or through electronics included in it, once an energy harvesting IC or similar circuit reports that sufficient energy has been transmitted for operating the operating element unit. The data communication can be unidirectional or bidirectional (e.g. according to the NFC standard) in order to display desired information on the display device or through the display element of the operating element unit.

An application area of the invention relates to, for example, an operating device with a display on which a rotary adjuster or a rotary/pressure adjuster of an operating element unit is arranged, which can be used, for example, to specify the temperature of the vehicle's air-conditioner. By rotating the rotary adjuster, the desired temperature is set, wherein the currently set temperature is displayed by the display element or the display device of the operating element unit. A correspondingly required sensor system (e.g. working in a capacitive, optical or resistive manner) would then have to be provided in the operating element unit. Alternatively, the sensor system of a display adapted as a touchscreen could be used, which is described in detail below.

In a further advantageous embodiment of the invention it can be provided that the at least one first coil or at least one of the first coils and the at least one second coil or at least one of the second coils is further adapted for a wireless unidirectional or bidirectional data communication between the control and evaluating unit of the operating element unit and a signal and data processing unit or a communication interface arranged outside the operating element unit and particularly on and/or in the housing.

In a further embodiment of the invention it can be provided that the operating element unit is provided with a near field signal transmission interface for wireless communication with a communication interface located outside the operating element unit and outside the housing. Here it is provided that the operating element unit has a near field signal transmission interface, such as a Bluetooth interface, via which the data communication with a corresponding communication interface takes place, wherein the communication interface is outside the operating element unit and outside the housing and thus arranged elsewhere in the vehicle. Such a wireless communication link could then be used for a data communication at a higher rate than when using energy transmission coils.

In a further advantageous embodiment of the invention it can be provided that the operating element unit comprises at least one operating key, preferably an operating key bar or an operating key field with respectively several operating keys, and/or a rotary adjuster, particularly with a press and rotary function, and/or a touchpad for data entry, and/or it can be provided that the display element or the display device of the operating element unit is adapted as a touchscreen.

It may also be useful if the front face of the housing comprises a display, wherein the operating element unit is positioned and/or positionable on and/or in front of the display.

It is also useful if the display of the housing comprises a backlight unit with a light emitting surface facing the back of the display, wherein the at least one first coil is arranged in the backlight unit.

It is also possible to provide the operating element unit with a force-feedback function or with a force-sense/force-feedback function in the operating element unit itself. The operating element unit can be positioned reversibly removable (e.g. by adhesive bonding material, gel, suction cup, etc.) or can be positioned permanently.

As aforementioned, it can be advantageous if the display is adapted as a touchscreen comprising a capacitive and/or resistive and/or optical touch panel, wherein the operating element unit is arranged in front of and/or on the touch panel. If a display with a touch function is used, i.e. a touch-sensitive display, it is useful if a manual actuation of the operating element unit can be sensed by means of the touchpad of the display.

The operating element unit can thus be provided with a function sensor system or with a display device or with both and can be arranged on a housing wall without or with a display function (display). In all aforementioned cases, the essential feature of the invention is that an electric consumer of the control element unit is inductively supplied with electric energy through the housing wall.

In order to explain the advantages of this embodiment of the invention, it is noticeable that the interior of the vehicle is increasingly equipped with touch operating units with touch fields, which can be used to operate various vehicle components. But also so-called rotary adjusters for entering and confirming operation parameters and operating functions for vehicle components are becoming increasingly popular. For detecting the current position of the rotary adjuster as well as for confirming an entry, known rotary adjusters have a sensor system that is occasionally quite elaborately constructed, which increases production costs. If a rotary adjuster is used with a touch operating unit arranged adjacent to it, both are two components separated from each other with surfaces that are in this respect also separated from each other.

It is therefore an advantage if the operating device for a vehicle component is provided with
   a touch operating unit with manually operable touch fields that comprises a touch-sensitive and/or pressure-sensitive operating surface and a sensor system arranged below the surface for detecting the position of a touch and/or of exerted pressure on the operating surface,
   an evaluating unit operatively connected to the sensor system for receiving signals from the sensor system and for evaluating the signals in order to detect a manual actuation of the operating surface and in order to trigger an operating function defined by the position of the actuation of the operating surface, and
   a rotary adjuster comprising a holding element and a manually operable rotary element arranged thereon,
   wherein the holding element is arranged in a partial area of the operating surface of the touch operating unit and comprises at least one rotary position detection element, which can be detected by the sensor system assigned to the partial area of the operating surface of the touch operating unit, for a touch of and/or for a pressure exertion on the operating surface at a position in the partial area, and
   wherein the evaluating unit detects by means of signals received by the sensor system an actuation of the operating surface of the touch operating unit by means of the at least one rotary position detection element of the rotary element of the rotary adjuster and triggers an operating function assigned by means of the position of the at least one rotary position detection element.

With this further embodiment of the invention, it is correspondingly proposed to integrate the rotary adjuster or, more generally, the operating element unit, if it does not have a function sensor system, into the touch operating unit insofar as their sensor technology is used to detect the current rotary adjuster adjustment position. According to the invention, a rotary adjuster, which has a holding element and a manually operable rotary element rotatably arranged on it, is arranged on or above a manually operable touch operating unit with a touch-sensitive and/or a pressure-sensitive operating surface and a sensor system arranged below the operating surface. The rotary element is provided with at least one rotary position detection element moving above or on the operating surface of the touch operating unit when rotating the rotary element. The respective position of the rotary position detection element can only be detected by the sensor system of the touch operating unit. In a corresponding manner, pressing an operating key of the operating element unit can also be detected by the sensor system of the touchscreen, wherein the detection of the actuation on the touchscreen is spatially-resolved.

In the area of the operating surface of the touch operating unit in which the holding element of the rotary adjuster is arranged, further symbol fields or touch fields for manually entering operating functions can be displayed or provided. For example, the rotary adjuster can be adapted as a ring so that the operating surface of the touch operating unit would be visually accessible through the inside of the ring. Alternatively, the information of the operating surface of the touch operating unit could be guided within the ring via optical light guiding elements, such as optical light fiber components, to the surface of the rotary adjuster. Such entry fields or display fields can, however, be presented on the operating surface of the touch operating unit of the aforementioned area so that the touch operating unit according to the invention can be operated with the finger of a hand as well as by rotating the rotary adjuster.

The holding element of the rotary adjuster can, for example, be attached on the operating surface by bonding. However, it is also conceivable that the hold element is arranged on the operating surface without directly being fixed to it; in this case, the holding element is attached, for example, on a frame or the like surrounding the touch operating unit respectively adjacent elements. The rotary element can be adapted as a rotary ring or a rotary adjuster with or without additional actuation elements and/or display elements and/or with or without a touchpad.

An operating unit with a capacitive, resistive or optical sensor system is suitable as a touch operating unit. In the case of a capacitive sensor system, the manually operable rotary element and the at least one rotary position detection element are electrically conductive, so that the operator's self-capacitance via the rotary element and the rotary position detection element influences the potential distribution in the sensor system. Alternatively, pressure-sensitive touch operating units can be used. The touch operating units are locally reversibly deformable, wherein the location of the deformation is detected resistively or optically (by so-called FTIR sensors—Frustrated Total Internal Reflection).

Due to the integration of the operating element unit in form of, for example, at least one rotary adjuster on the operating surface of a touch operating unit, according to the invention, it is not required anymore to separate the surfaces. Any positioning and dimensioning of the rotary adjuster(s) is possible without having to change the touch operating unit. The rotary adjuster adjustment position is evaluated by means of the sensor system available for the touch operating unit and detecting the (rotary) position of the at least one rotary position detection element that moves on a circular path when the rotary adjuster is adjusted so that no separate evaluating electronics a re required for the rotary adjuster, but the evaluating electronics that are already available for manually actuating touch operating units can be used.

In a further advantageous embodiment of the invention it can be provided that an acoustic, optical and/or tactile feedback is provided when manually actuating a touch field of the touch operating unit. The corresponding acoustic, optical and/or tactile feedback does not necessarily have to be provided even if an operating function is selected by means of the rotary element. Entering a command by means of the rotary element can then be carried out, for example, by pressing down the rotary element and can thus be "recognized" by the operator.

Referring to this, it may be advantageous if the rotary element on the holding element is arranged reversibly movable towards the operating surface of the touch operating unit and/or is reversibly pressable against the operating surface of the touch operating unit, wherein the evaluating unit detects an actuation of the operating surface by means of the at least one rotary position detection element of the rotary element in its state moved in the direction of the operating surface and/or pressed against the operating surface. By pressing down the rotary element for entering a command by means of the rotary element, the rotary position detection element approaches the operating surface of the touch operating unit, which is detected by the sensor system of the touch operating unit due to different signal strengths. If the touch operating unit is a resistive or optical operating unit with a locally elastically deformable operating surface, the sensor system can also detect different signal strengths and can thus detect a press function when pressing against the operating surface by means of the rotary position detection element. It is detected from a minimum pressure or a minimum pressing force that the rotary element is pressed. Thus, the corresponding function entry is accepted.

It can therefore be advantageous in this respect if the rotary element comprises a pressure detection element for touching and/or approaching the operating surface and/or for exerting pressure on the operating surface of the touch operating unit when the rotary element is pressed, wherein the evaluating unit detects the pressed state due to a signal from the sensor system when touching and/or at least approaching the operating surface and/or exerting pressure on the operating surface of the touch operating unit.

In a further advantageous embodiment of the invention it can be provided that the sensor technology of the touch operating unit emits a different signal at a position when touching and/or approaching the operating surface than when exerting pressure on the operating surface of the touch operating unit at this position. Alternatively or additionally, when pressure is exerted to the operating surface of the touch operating unit, the sensor system can emit a signal at a position with a signal strength depending on the magnitude of the pressure. In all these cases, the evaluating unit uses these signals to detect whether the rotary element is pressed or not.

As aforementioned, the holding element of the rotary adjuster is arranged on the operating surface and secured from undesired displacement. For example, it is possible that the holding element is fixed abutting on the operating surface. The contacting of the operating surface is either ignored by the sensor system or the area of the operating surface in which the holding element is fixed is free from a sensor system.

Alternatively, it is also possible that the holding element of the rotary adjuster(s) is displaceably arranged on the operating surface in order to approach various touch fields with the rotary adjuster and then perform an entry function by rotating the rotary adjuster's rotary element. The rotary adjuster is fixed, for example, mechanically.

The embodiments of the invention described above using a rotary (press) adjuster (with display) as an example of an operating element of the operating unit also apply accordingly to operating keys (with display).

It is also conceivable that the rotary element is arranged on the holding element in a latching rotational or in a free rotational manner.

Figure 4:
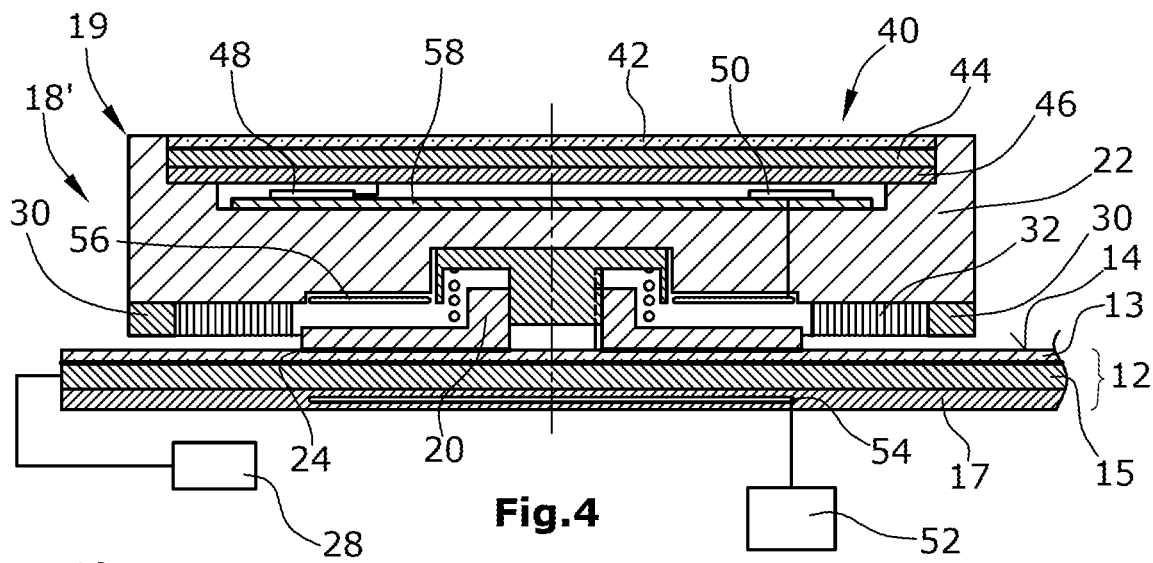
Figure 5:
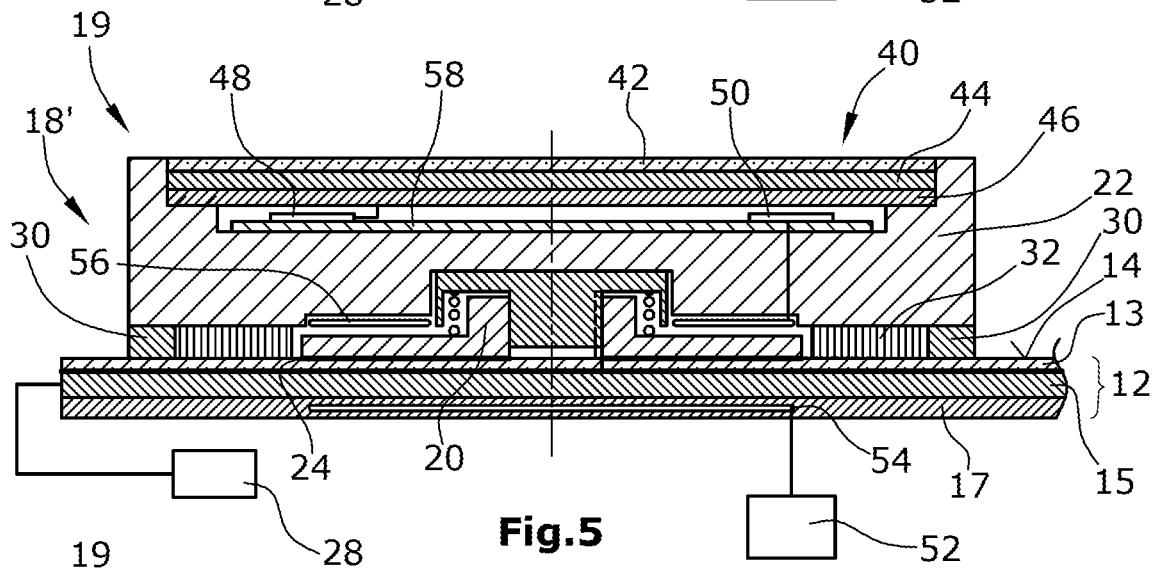
Figure 6:
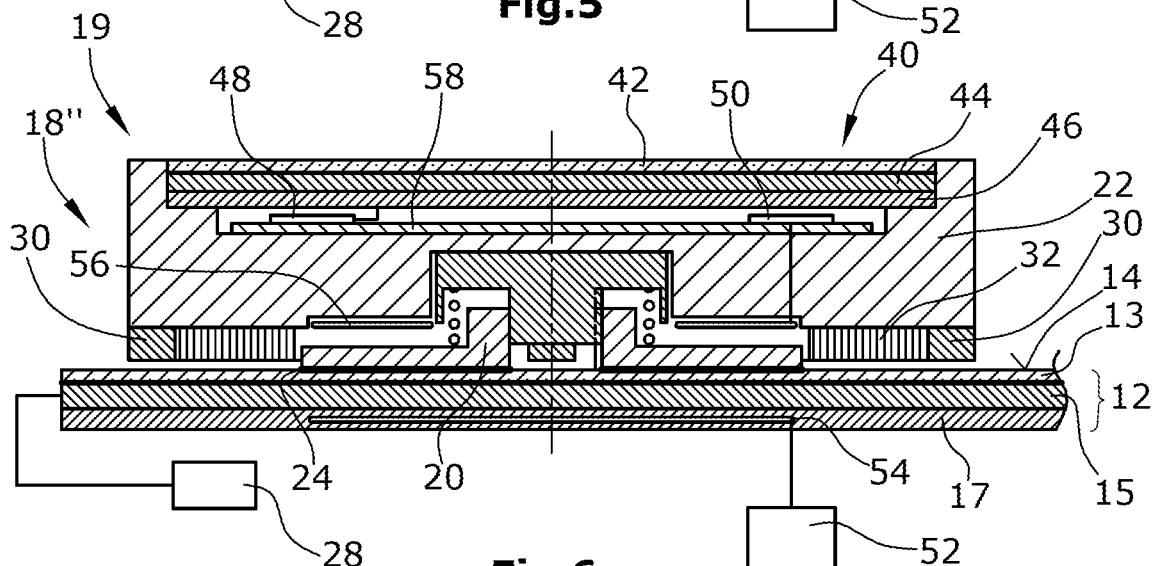
Figure 7:
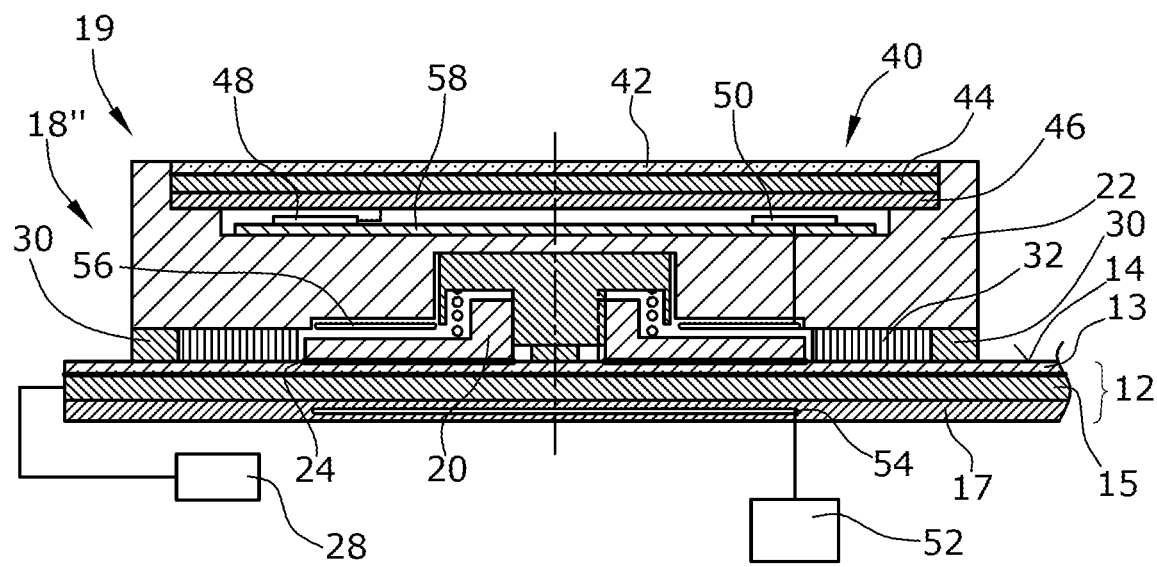
Figure 8:
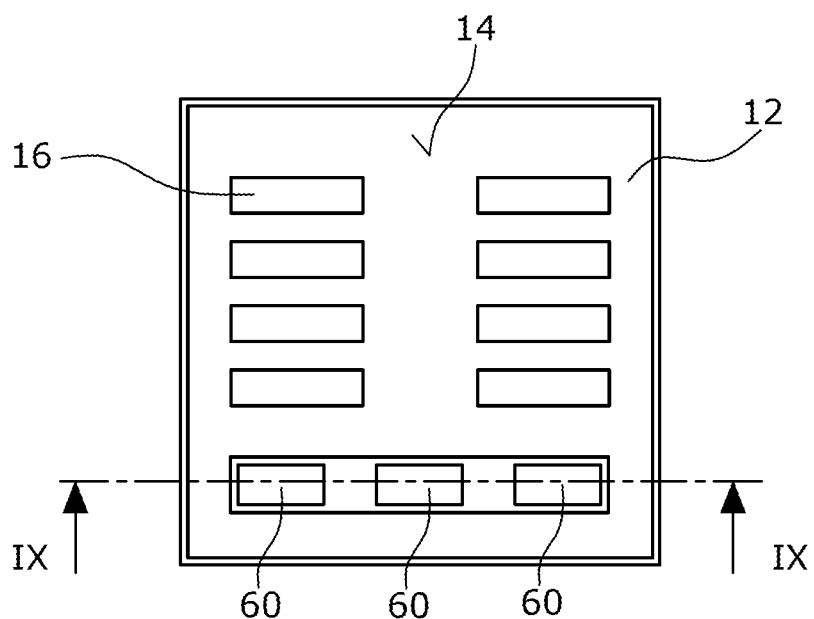
Figure 9:
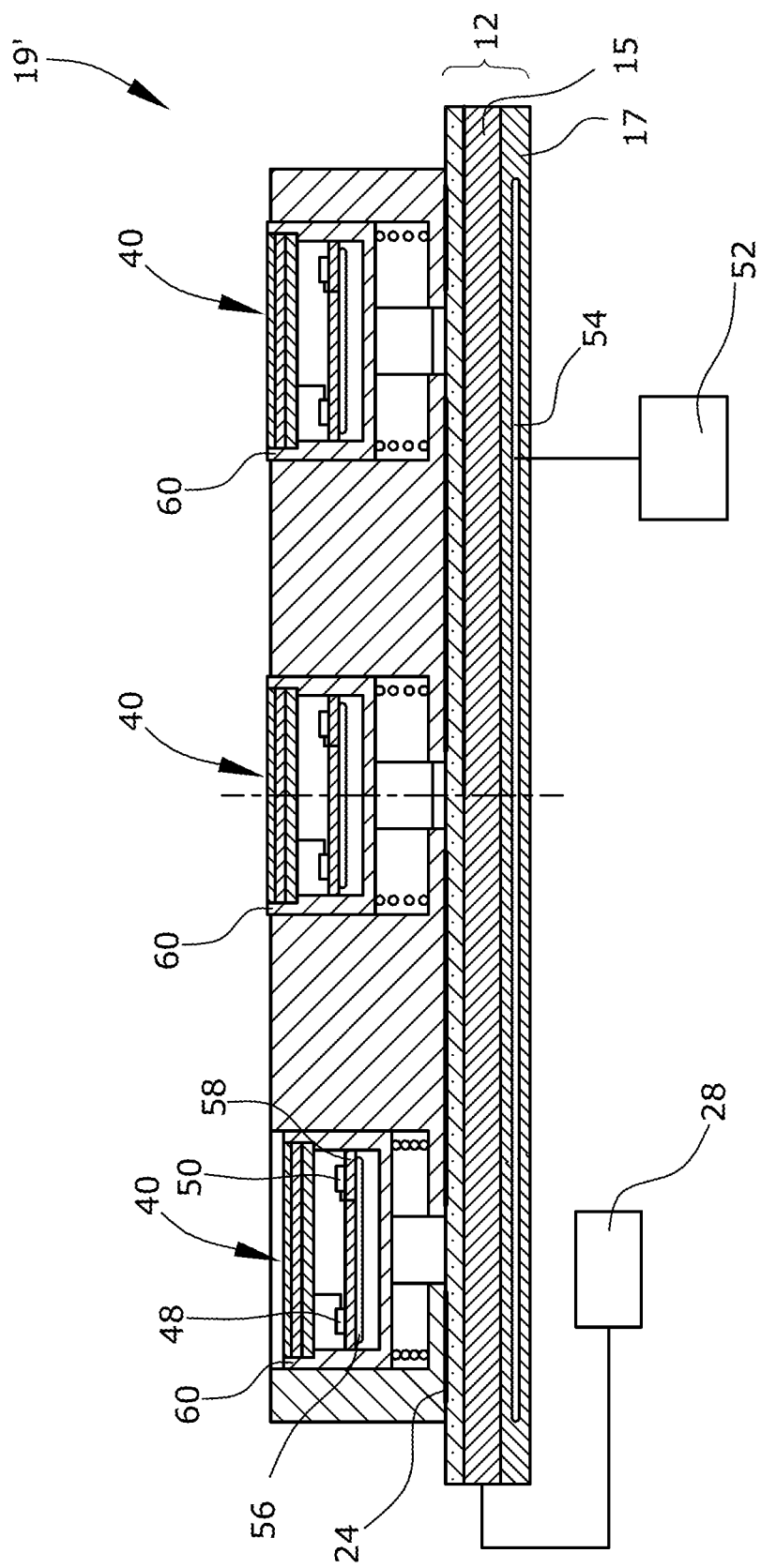

In the following, the invention is explained in more detail by using various exemplary embodiments and by reference to the drawing. The individual figures show the following:

FIG. 1 a perspective view on the front area of the center console of a vehicle having a touch operating unit 12 arranged on the center console comprising manually operable touch fields and a rotary adjuster, FIG. 2 a section view through the touch operating unit in the area of the rotary adjuster according to II-II of FIG. 1, FIG. 3 a view of the bottom side of the rotary adjuster according to FIG. 2, FIGS. 4 and 5 a further exemplary embodiment of a rotary adjuster that is arranged on the operating surface of a touch operating unit and can be pressed down to confirm an entry, FIGS. 6 and 7 a further exemplary embodiment of a rotary adjuster that is arranged on the operating surface of a touch operating unit and can be pressed down to confirm an entry, and FIGS. 8 and 9 a further exemplary embodiment in a front view and in a section view.

In the following, the invention, namely the wireless supply of electric/electronic components of an operating element unit located on a display by using a rotary adjuster or a rotary/pressure adjuster, is described, whose rotary position and, if provided, press function is further detected by a touch sensor system of the display, which is not necessarily required for the invention, but may be advantageous.

FIG. 1 shows a perspective view on the center console of a vehicle interior in the area of the passage from the center console to the instrument panel, wherein in this area a human-machine interface 11 provided in/on a housing 10 is arranged for displaying and/or entering operation parameters and functions for one or more vehicle components. The human-machine interface 11 comprises a display 12 in form of a touchscreen with a touch panel 13 and is provided with an operating surface 14 with touch fields 16 that can be displayed on it, with a display generation layer 15 (e.g. with LCD technology) and with a backlight unit 17. In addition to the touch fields 16, the display 12 comprises arranged on its operating surface an operating element unit 19 in form of a rotary adjuster 18, which, as exemplary shown in FIG. 2, comprises a holding element 20 and a rotary element 22 rotatably mounted on the holding element 20. The holding element 20 is, as already mentioned in 24, bonded on the operating surface 14.

According to the invention, the rotary element 22 of the rotary adjuster 18 is provided with a display device 40 that is arranged either rigidly or rotatable with the rotary element 22 in the rotary adjuster 18. The display device 40 is adapted, for example, as an LCD touchscreen and comprises a touch panel 42, an LCD panel 44 and a backlight unit 46. The display device 40 is controlled by a control and evaluating unit that is also responsible for evaluating the touch sensor system of the touch panel 42.

An energy supply unit 50, which is supplied inductively and thus wirelessly with electric energy, serves as an energy supply. For this purpose, the operating device comprises a control unit 52 that supplies a first energy transmission coil 54 with alternating voltage respectively alternative current. This first energy transmission coil 54 is, as can be seen in FIG. 2, located within the backlight unit 17 of the display 12. A second energy transmission coil 56 that is inductively coupled with the first energy transmission coil 54 is arranged in the rotary adjuster 18, namely in its rotary element 22 above the holding element 20. The energy required for operating the display device 40 and its touch panel 42 is thus inductively transported through the display 12 so that wiring from the housing 10 of the human-machine interface 11 to the rotary adjuster 18 is not required.

The rotary adjuster 18 respectively the rotary element 22 may include additional electronics on a PCB 58. These electronics may, for example, comprise and control a communication interface with which a connection between the rotary adjuster 18 and a corresponding communication interface in the vehicle can be created via a near field communication. However, it is also conceivable that the two energy transmission coils 54, 56 are provided in a limited manner for a data communication.

FIG. 2 shows only a single first energy transmission coil 54. Alternatively, several of such first energy transmission coils can be arranged on the backside of the display 12 or within its backlight unit 17. These first energy transmission coils 54 are arranged distributed across the surface of the display so that when the rotary adjuster 18, which can, for example, be positioned removably on the display 12, is positioned in a different position, an inductive energy supply for operating its display device 40 is also possible.

As known, the touch operating unit 12 comprises a sensor system located below the operating surface 14 and being, for example, capacitive sensitive. The signals emitted by the sensor system are supplied to a control and evaluating unit 28 that also serves for controlling the sensor system.

In the following, it is described how the touch sensor system of the display 12 can be used for the rotary adjuster in order to determine the rotary position or to detect a press function of a rotary adjuster 18. This is explained by using several exemplary embodiments, whereby it applies for all exemplary embodiments that the energy supply for the electric/electronic components of the rotary adjuster 18 is inductive and thus wireless. It should be mentioned at this point that the rotational positioning of the rotary adjuster 18 can also be carried out with an own sensor system (not displayed) assembled in the rotary adjuster 18, wherein the data is transmitted via the rotary position and optionally the data characterized by a press function is transmitted wirelessly via the energy transmission coils 54, 56 or via another wireless interface.

The rotary adjuster 18 comprises at least one rotary position detection element 30 on the bottom side of its rotary element 22 that is adapted, for example, as a segment. In the described application case according to FIG. 2, the rotary element 22 is provided with two of such rotary position detection elements 30.

The two rotary position detection elements 30 move longitudinally of a circular path over the operating surface 14 when the rotary element 22 is rotated. The respective positions of the two rotary position detection elements 30 can be detected by the sensor system. The areas 32 between the rotary position detection elements 30 on the bottom side of the rotary element 22 (see FIG. 3) cannot be sensed by the sensor system. If the sensor system works, for example, capacitively, at least the surface of the rotary element 22 as well as the surface of the rotary position detection elements 30 can be electrically conductive in order to use the operator's self-capacitance for the potential displacement sensed by the sensor system.

Thus, it is possible according to the invention to sense and detect the current rotary position of the rotary adjuster 18 by means of the sensor system of a touch operating unit 12. An exemplary embodiment is shown in FIG. 2 in which the rotary position detection elements 30 move on or in close proximity above the operating surface 14. It would also be conceivable that, for example in case of a locally reversibly deformable operating surface 14, as is the case with resistive or optical touch sensors, the rotary position detection elements 30 abut with pressure on the operating surface 14.

There are various solution approaches for detecting the current rotary position of the rotary element 22 at the moment at which an operating function or an operation parameter shall be entered. For example, it would be conceivable that a detected standstill of the rotary adjuster 18, which is sensed for a certain, relatively short minimum time, is evaluated as an indication that the adjustment of the rotary adjuster 18 has been completed and that the operation parameters or operating functions relating to the adjustment shall now be entered. Accepting the operating entry can, for example, be confirmed by a haptic feedback. Such particularly tactile feedback in touch operating units 12 is generally known. Instead of or in addition to a tactile feedback, an acoustic or optical feedback can also be provided. Corresponding mechanics and mechanisms are available for known touch operating units 12.

However, it is much more intuitive if the operator presses down the rotary adjuster 18 in a certain position, in order so signalize that he/she wants to make an entry, namely the entry corresponding to the rotary position. FIGS. 3 and 4 show in a cross-section view a corresponding embodiment of such a rotary adjuster 18'. Provided that the individual components shown in FIGS. 3 and 4 correspond to those in FIG. 2, they have the same reference numerals.

The touch operating unit 12 according to the FIGS. 4 and 5, for example, also works capacitively. In an unpressed state of the rotary adjuster 18' its rotary element 22 and its rotary position detection elements 30 comprise a greater distance to the operating surface 14 than in the pressed state (see in comparison FIGS. 4 and 5). The sensor system now uses the strength of the capacitive influence to detect whether the rotary position detection elements 30 are located directly on the operating surface 14 (see FIG. 5) or at a slight distance from it (see FIG. 4). This is used in the evaluating unit 28 in order to detect that the user has made an entry corresponding to the rotary position by pressing drown the rotary element 22 or not.

In FIGS. 6 and 7 a further exemplary embodiment of a pressed down rotary adjuster 18" is described, whereby for this case it also applies that the individual components shown in these figures, provided they functionally or constructively correspond to those of FIGS. 2 to 5, have the same reference numerals.

The particularity in the exemplary embodiment of the rotary adjuster 18" according to FIGS. 6 and 7 is that the press function and the thus intended entry confirmation by pressing down the rotary element 22 is carried out by means of the detection of a press detection element 34 that is located, for example, as the rotary position detection elements 30 on the bottom side of the rotary element 22, namely, for example, in its center. If the sensor system responds to the approach of the pressure detection element 34 to the operating surface 14 or to its contacting, as is the case when the rotary adjuster 18" is depressed (see FIG. 7), this is an indication that the function or operating entry corresponding to the rotary position of the rotary element 22 shall be made.

FIGS. 8 and 9 show that the operating element unit 19' can (also) comprise operating keys 60 instead of a rotary adjuster. In this case it also applies that a display 40 arranged in an operating key 60 is supplied by inductively transmitted electric energy, which is subject of the invention. The keys are actuated, for example, via the touch sensor system of the display 12 (see e.g. the pressed operating key shown in FIG. 9 on the left side).

LIST OF REFERENCE NUMERALS

10 housing
11 human-machine interface
12 display
12' display
13 touch panel
14 operating surface
15 display generation layer (e.g. LCD)
16 touch fields
17 backlight unit
18 rotary adjuster
18' rotary adjuster
18" rotary adjuster
19 operating element unit
19' operating element unit
20 holding element
22 rotary element
24 bonding of holding element on operating surface
28 evaluating unit
30 rotary position detection element
32 area of the bottom side of the rotary element between or outside the rotary position detection elements
34 press detection element
40 display device
42 touch panel of display device
44 LCD panel of display device
46 backlight unit of display device
48 control and evaluating unit in rotary adjuster
50 energy supply unit
52 control unit
54 first energy transmission coil
56 second energy transmission coil
58 PCB
60 operating key

The invention claimed is:

1. Operating device for a human-machine interface (HMI) for vehicles, comprising:
    a housing having a front wall comprising a front face with a display surface and a rear face facing away from the front face; and
    an operating element unit positioned and/or positionable on or in front of the front wall of the housing for manually triggering operating functions and/or for manually adjusting parameters of operating functions for a vehicle component,
    wherein the operating element unit comprises at least one operating element, an electric consumer, and an energy supply unit,
    wherein in order to supply electric energy to the energy supply unit of the operating element unit, at least one first coil is arranged so as to face the rear face of the front wall, wherein at least one second coil, which is inductively coupled to the at least one first coil and is connected to the energy supply unit, is arranged in front of the display surface and in and/or on the operating element unit, and
    wherein the at least one first coil is arranged behind the display surface.

2. Operating device according to claim 1, wherein the at least one first coil or at least one of the first coils and the at least one second coil or at least one of the second coils is further provided for a wireless unidirectional or bidirectional data communication between the operating element unit and a signal and data processing unit arranged outside the operating element unit and particularly on and/or in the housing, or a communication interface arranged outside the operating element unit and particularly on and/or in the housing.

3. Operating device according to claim 1, wherein a wireless data communication link is provided between the operating element unit and a communication interface is arranged on and/or in the housing, wherein the wireless data communication link comprises two coils, one of which is arranged in the operating element unit and the other outside the operating element unit.

4. Operating device according to claim 2, wherein a wireless data communication link is provided between the operating element unit and a communication interface is arranged on and/or in the housing, wherein the wireless data communication link comprises two coils, one of which is arranged in the operating element unit and the other outside the operating element unit.

5. Operating device according to claim 1, wherein the operating element unit is provided with a near field signal transmission interface for wireless communication with a communication interface located outside the operating element unit and outside the housing.

6. Operating device according to claim 1, wherein the operating element unit comprises at least one operating key, preferably an operating key bar or an operating key field with respectively several operating keys, and/or a rotary adjuster, particularly with a press and rotary function, and/or as an electric or electronic consumer, a touchpad for data entry, and/or a display element or a display device, and/or a touchscreen.

7. Operating device according to claim 1, wherein the front face of the housing comprises a display and the operating element unit is positioned or positionable on and/or in front of the display.

8. Operating device according to claim 7, wherein the display of the housing comprises a backlight unit with a light emitting surface facing the back of the display, and the at least one first coil is arranged in the backlight unit.

9. Operating device according to claim 7, wherein the display is adapted as a touchscreen and comprises a capacitive and/or resistive and/or optical touch panel, and the operating element unit is arranged in front of and/or on the touch panel.

10. Operating device according to claim 8, wherein the display is adapted as a touchscreen and comprises a capacitive and/or resistive and/or optical touch panel, and the operating element unit is arranged in front of and/or on the touch panel.

11. Operating device according to claim 1, wherein the operating element unit is provided with a force feedback function or a force sense/force feedback function in the operating element unit.

12. Operating device according to claim 9, wherein a manual actuation of the operating element unit can be sensed by means of the touch panel of the display.

13. Operating device according to claim 11, wherein a manual actuation of the operating element unit can be sensed by means of the touch panel of the display.

14. Operating device according to claim 1, wherein the operating element unit is positioned in a fixed or reversible manner.

15. Operating device according to claim 1, wherein the front wall of the housing comprises a display which includes a touchscreen, and
   wherein the display further includes any one of an LCD, an LED, a micro LED, an OLED, a Q-dot or an E-Ink display.

16. Operating device for a human-machine interface (HMI) for vehicles, comprising:
   a display comprising a front surface and a rear surface opposing each other; and
   an operating element unit positioned and/or positionable on or in front of the front surface of the display for manually triggering operating functions and/or for manually adjusting parameters of operating functions for a vehicle component,
   wherein the operating element unit comprises at least one operating element, an electric consumer, and an energy supply unit,
   wherein in order to supply electric energy to the energy supply unit of the operating element unit, at least one first coil is arranged so as to face the rear surface of the display, wherein at least one second coil, which is inductively coupled to the at least one first coil and is connected to the energy supply unit, is arranged in and/or on the operating element unit, and
   wherein at least a portion of the at least one first coil is embedded in the rear surface of the display.

17. Operating device according to claim 16, wherein the display further comprises a touchscreen and any one of an LCD, an LED, a micro LED, an OLED, a Q-dot or an E-Ink display.

18. Operating device according to claim 16, wherein the display further comprises a backlight unit with a light emitting surface facing the back of the display, and the at least one first coil is arranged in the backlight unit.

* * * * *